US010916598B2

(12) United States Patent
Li et al.

(10) Patent No.: US 10,916,598 B2
(45) Date of Patent: Feb. 9, 2021

(54) OLED ARRAY SUBSTRATE, METHOD FOR FABRICATING THE SAME, OLED PIXEL CIRCUIT, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Meng Li, Beijing (CN); Yongqian Li, Beijing (CN); Min He, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/440,615

(22) Filed: Jun. 13, 2019

(65) Prior Publication Data
US 2019/0386033 A1 Dec. 19, 2019

(30) Foreign Application Priority Data
Jun. 15, 2018 (CN) .......................... 2018 1 0621057

(51) Int. Cl.
*H01L 21/00* (2006.01)
*H01L 29/201* (2006.01)
(Continued)

(52) U.S. Cl.
CPC ....... *H01L 27/3227* (2013.01); *G09G 3/3233* (2013.01); *H01L 27/1262* (2013.01); *H01L 2227/323* (2013.01)

(58) Field of Classification Search
CPC ...................... H01L 27/3258; H01L 27/3269
(Continued)

(56) References Cited

U.S. PATENT DOCUMENTS 7,586,254 B2 * 9/2009 Kwak ................... G09G 3/3233
257/88
8,164,257 B2 * 4/2012 Choi ..................... H01L 27/3276
313/512
(Continued)

FOREIGN PATENT DOCUMENTS

| CN | 101976679 A | 2/2011 |
| JP | 2009238833 A | 10/2009 |
| WO | 2017206547 A1 | 12/2017 |

OTHER PUBLICATIONS

China First Office Action, Application No. 201810621057.1, dated Mar. 30, 2020, 28 pps.: with English translation.

*Primary Examiner* — Calvin Lee
(74) *Attorney, Agent, or Firm* — Armstrong Teasdale LLP

(57) ABSTRACT

Embodiments of the present disclosure provide an OLED array substrate, a method for fabricating an OLED array substrate, an OLED pixel circuit, an OLED array substrate including the OLED pixel circuit, and a display device including the OLED array substrate. The OLED array substrate includes a substrate, an OLED arranged on the substrate, and a photosensor positioned between the OLED and the substrate. The photosensor includes a first electrode, a photosensitive layer, and a second electrode sequentially arranged from bottom to top. The OLED includes an anode, an organic light-emitting layer, and a cathode sequentially arranged from bottom to top. The anode includes a first portion and a second portion.

20 Claims, 6 Drawing Sheets

(51) Int. Cl.
  *H01L 27/32* (2006.01)
  *G09G 3/3233* (2016.01)
  *H01L 27/12* (2006.01)
(58) Field of Classification Search
  USPC .................................. 257/81–83, 90; 438/40
  See application file for complete search history.

(56) References Cited

U.S. PATENT DOCUMENTS

| | | |
|---|---|---|
| 9,305,989 B2* | 4/2016 | In ........................ H01L 51/5218 |
| 2015/0249119 A1 | 9/2015 | In et al. |
| 2020/0083205 A1* | 3/2020 | Ding ....................... H01L 27/32 |

* cited by examiner

OLED ARRAY SUBSTRATE, METHOD FOR FABRICATING THE SAME, OLED PIXEL CIRCUIT, AND DISPLAY DEVICE

CROSS REFERENCE TO RELATED APPLICATIONS

This patent application claims the benefit and priority of Chinese Patent Application No. 201810621057.1 filed on Jun. 15, 2018, the disclosure of which is incorporated by reference herein in its entirety as part of the present application.

BACKGROUND

The present disclosure relates to the field of display technologies, and more particularly, to an organic light-emitting diode (OLED) array substrate, a method for fabricating the OLED array substrate, an OLED pixel circuit, and a display device.

In recent years, OLED display devices have gradually become one of hot spots in the field of current display technologies. Compared with traditional liquid crystal displays, OLED display devices have ultra-high contrast ratio, ultra-thin thickness, ultra-wide color gamut, good large-angle viewing experience, ultra-fast response speed, and so on. Therefore, the OLED display devices will occupy more market share in the future.

BRIEF DESCRIPTION

Embodiments set forth in the present disclosure provide an OLED array substrate, a method for fabricating the OLED array substrate, an OLED pixel circuit, an OLED array substrate including the OLED pixel circuit, and a display device including the OLED array substrate. A first aspect of the present disclosure provides an OLED array substrate. The OLED array substrate includes a substrate, an OLED arranged on the substrate, and a photosensor positioned between the OLED and the substrate. The photosensor includes a first electrode, a photosensitive layer, and a second electrode sequentially arranged from bottom to top. The OLED includes an anode, an organic light-emitting layer, and a cathode sequentially arranged from bottom to top. The anode includes a first portion and a second portion. An orthographic projection of the first portion on the substrate does not overlap with an orthographic projection of the photosensitive layer on the substrate. An orthographic projection of the second portion on the substrate overlaps with the orthographic projection of the photosensitive layer on the substrate, and the second portion is transparent. The second electrode includes the second portion of the anode.

In some embodiments of the present disclosure, the anode includes a groove in the second portion of the anode. The second electrode is arranged within the groove.

In some embodiments of the present disclosure, a surface of the second electrode away from the substrate is flush with a surface of the anode away from the substrate.

In some embodiments of the present disclosure, the OLED array substrate further includes a pixel defining layer positioned between the anode and the organic light-emitting layer and provided with an opening. A light emission region of the organic light-emitting layer is positioned in the opening of the pixel defining layer.

In some embodiments of the present disclosure, the OLED array substrate further includes a first transistor and a second transistor positioned on the substrate and on a side of the photosensor facing toward the substrate, and a first dielectric layer and a second dielectric layer sequentially arranged between the anode and the substrate. An active layer and a gate stack of the first transistor and an active layer and a gate stack of the second transistor are positioned in the second dielectric layer, and the photosensitive layer and the first electrode of the photosensor are positioned in the first dielectric layer. The first electrode of the photosensor is electrically connected to a source/drain electrode of the second transistor through a first hole in the first dielectric layer. The first portion of the anode is electrically connected to a source/drain electrode of the first transistor through a second hole in the first dielectric layer.

In some embodiments of the present disclosure, the OLED array substrate further includes a third hole in the first dielectric layer positioned between the first hole and the second hole. The first portion of the anode is further electrically connected to the source/drain electrode of the first transistor through the third hole.

In some embodiments of the present disclosure, the first dielectric layer includes a first sublayer and a second sublayer sequentially arranged between the substrate and the anode. The source/drain electrode of the first transistor and the source/drain electrode of the second transistor are positioned in the first sublayer. The photosensitive layer and the first electrode of the photosensor are positioned in the second sublayer.

In some embodiments of the present disclosure, the second portion of the anode serves as a first portion of the second electrode. The second electrode further includes a transparent second portion and a third portion. The second portion of the second electrode is positioned between the first portion of the second electrode and the photosensitive layer. The third portion of the second electrode extends from the second portion of the second electrode to the second hole and is spaced apart from the first portion of the anode. The OLED array substrate further includes a third hole in the first dielectric layer positioned between the first hole and the second hole. The third portion of the second electrode is electrically connected to the source/drain electrode of the first transistor through the third hole.

In some embodiments of the present disclosure, the first dielectric layer includes a first sublayer, a second sublayer, and a third sublayer sequentially arranged between the substrate and the anode. The source/drain electrode of the first transistor and the source/drain electrode of the second transistor are positioned in the first sublayer. The photosensitive layer and the first electrode of the photosensor are positioned in the second sublayer. The second portion and the third portion of the second electrode are positioned in the third sublayer.

In some embodiments of the present disclosure, the first portion of the anode is a light reflection layer and the cathode is a light transmission layer, or the anode is the light transmission layer and the cathode is the light reflection layer.

In some embodiments of the present disclosure, a ratio of an area of the second portion of the anode to an area of the light emission region of the organic light-emitting layer is less than or equal to 5%.

A second aspect of the present disclosure provides a method for fabricating an OLED array substrate. The method includes providing a substrate, forming a photosensor on the substrate, and forming an OLED on the photosensor. The photosensor includes a first electrode, a photosensitive layer, and a second electrode sequentially arranged from bottom to top. The OLED includes an anode, an organic light-emitting layer, and a cathode sequentially arranged from bottom to top. The anode includes a first portion and a second portion. An orthographic projection of the first portion on the substrate does not overlap with an orthographic projection of the photosensitive layer on the substrate. An orthographic projection of the second portion on the substrate overlaps with the orthographic projection of the photosensitive layer on the substrate and the second portion is transparent. The second electrode includes the second portion of the anode.

In some embodiments of the present disclosure, forming the photosensor includes forming a first dielectric layer on the substrate, patterning the first dielectric layer to form an opening, forming the first electrode in the opening, forming the photosensitive layer on the first electrode in the opening, and forming the second electrode on the photosensitive layer.

In some embodiments of the present disclosure, the first electrode, the photosensitive layer, and the second electrode are formed using the same mask.

In some embodiments of the present disclosure, the forming the OLED includes forming a conductive layer reflecting light on the first dielectric layer, patterning the conductive layer to remove a portion of the conductive layer whose orthographic projection on the substrate overlaps with an orthographic projection of the photosensitive layer on the substrate, wherein a remaining portion of the conductive layer forms the first portion of the anode, forming a pixel defining layer having the opening on the anode, wherein an orthographic projection of the pixel defining layer on the substrate does not overlap with an orthographic projection of the photosensor on the substrate, forming the organic light-emitting layer in the opening of the pixel defining layer and on the pixel defining layer, and forming the cathode on the organic light-emitting layer.

In some embodiments of the present disclosure, the anode is a light transmission layer, and the anode and the second electrode are formed by the same film layer.

In some embodiments of the present disclosure, the method further includes prior to forming the first dielectric layer, forming a first transistor and a second transistor on the substrate, forming a second dielectric layer on the substrate to cover an active layer and a gate stack of the first transistor and an active layer and a gate stack of the second transistor, and forming corresponding source/drain electrodes respectively coupled to a source/drain region of the first transistor and a source/drain region of the second transistor through the second dielectric layer. The patterning the first dielectric layer further includes forming a first hole and a second hole. The first electrode is coupled to the source/drain electrode of the second transistor through the first hole, and the first portion of the anode is coupled to the source/drain electrode of the first transistor through the second hole.

In some embodiments of the present disclosure, the patterning the first dielectric layer further includes forming a third hole between the first hole and the second hole. The first portion of the anode is further electrically connected to the source/drain electrode of the first transistor through the third hole.

In some embodiments of the present disclosure, the patterning the first dielectric layer further includes forming a third hole between the first hole and the second hole. The forming the second electrode on the photosensitive layer includes forming a transparent conductive material on the photosensitive layer, and patterning the transparent conductive material to form the second electrode. The second electrode includes a first portion, a second portion, and a third portion. An orthographic projection of the first portion on the substrate and an orthographic projection of the second portion on the substrate are overlapped with an orthographic projection of the photosensitive layer on the substrate, the second portion is positioned between the first portion and the photosensitive layer, and the third portion extends from the second portion to the second hole and is spaced apart from the first portion of the anode. The third portion of the second electrode is electrically connected to the source/drain electrode of the first transistor through the third hole.

A third aspect of the present disclosure provides an OLED pixel circuit. The OLED pixel circuit includes a drive circuit, an optical sense circuit, a compensation circuit, and a light-emitting device. The drive circuit is coupled to the compensation circuit, the optical sense circuit and the light-emitting device, and is configured to drive the light-emitting device to emit light. The optical sense circuit is coupled to the drive circuit, the compensation circuit and the light-emitting device, and is configured to sense a light emission intensity of the light-emitting device and convert the light emission intensity into an electrical signal. The compensation circuit is coupled to the optical sense circuit and the drive circuit, and is configured to generate, based on the electrical signal, a compensation voltage for compensating for the light emission intensity of the light-emitting device, and provide the compensation voltage to the drive circuit.

In some embodiments of the present disclosure, the drive circuit includes a first transistor and a third transistor. A control electrode of the first transistor is coupled to a second electrode of the third transistor, a first electrode of the first transistor is coupled to a first voltage terminal, and a second electrode of the first transistor is coupled to the optical sense circuit and the light-emitting device. A control electrode of the third transistor is coupled to a first scanning signal terminal, and a first electrode of the third transistor is coupled to a data signal terminal.

In some embodiments of the present disclosure, the drive circuit further includes a fourth transistor and a first capacitor. A control electrode of the fourth transistor is coupled to a second scanning signal terminal, a first electrode of the fourth transistor is coupled to the second electrode of the first transistor, and a second electrode of the fourth transistor is coupled to the compensation circuit. A first terminal of the first capacitor is coupled to the control electrode of the first transistor, and a second terminal of the first capacitor is coupled to the second electrode of the first transistor.

In some embodiments of the present disclosure, the optical sense circuit includes a photosensor and a second transistor. A first electrode of the photosensor is coupled to a first electrode of the second transistor, and a second electrode of the photosensor is coupled to the drive circuit and the light-emitting device. A control electrode of the second transistor is coupled to a third scanning signal terminal, and a second electrode of the second transistor is coupled to the compensation circuit.

In some embodiments of the present disclosure, the light-emitting device includes an organic light-emitting diode.

A fourth aspect of the present disclosure provides an OLED array substrate, which includes the aforementioned OLED pixel circuit according to the third aspect.

A fifth aspect of the present disclosure provides a display device, which includes the aforementioned OLED array substrate according to the first aspect or the fourth aspect.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

DETAILED DESCRIPTION

Figure 1:
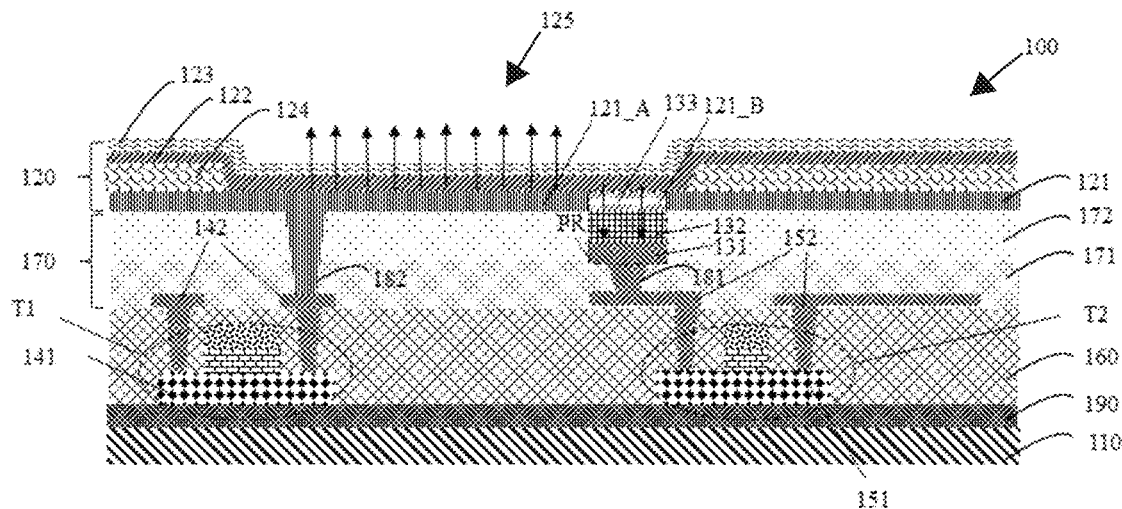
FIG. 1 illustrates a schematic diagram of an OLED array substrate according to an embodiment of the present disclosure.

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protection scope of the present disclosure.

Unless otherwise defined, all terms (including technical and scientific terms) used herein have the same meaning as commonly understood by those skilled in the art to which the present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on a P-type transistor. Therefore, in embodiments of the present disclosure, a controlled intermediate terminal of the transistor is referred to as a control electrode, a signal input terminal is referred to as a first electrode, and a signal output terminal is referred to as a second electrode. The transistors used in the embodiments of the present disclosure mainly are switching transistors. In addition, terms such as "first" and "second" are only used to distinguish one element (or a part of the element) from another element (or another part of this element).

For the purpose of surface description hereinafter, as direction-calibrated in the accompanying drawings, the terms "above", "below", "left", "right", "vertical", "horizontal", "top", "bottom" and derivatives thereof shall relate to an interrelationship. The terms "on", "on top of", "positioned on", or "positioned on top of" mean that, for example, a first element of a first structure is on a second element of a second structure, wherein an intermediate element may exist between the first element and the second element. The term "contact" means that, for example, the first element such as the first structure and the second element such as the second structure are connected, and other elements may exist or not exist on the interfaces of the two elements.

Generally, an OLED display device includes an OLED array substrate. The OLED array substrate includes an OLED and a drive transistor for driving the OLED. OLED likely encounters with uneven display after a long-term operation. Occurrence of this phenomenon is caused by, for example, a shift of the threshold voltage (Vth) of the drive transistor, which causes a variation of the current flowing through the OLED, thereby leading to uneven display brightness. The uneven display brightness also may likely be caused by aging of the OLED.

At present, the threshold voltage of the drive transistor is generally compensated by way of electrical compensation approach. However, the conventional electrical compensation approaches cannot compensate for the uneven light emission brightness caused by aging of the light-emitting device. Therefore, an embodiment of the present disclosure provides a display device having a photosensitive structure. The actual light intensity of the light-emitting device in the display device is sensed by the photosensitive structure, and the sensed light intensity is converted into an electrical signal to adjust the drive current for driving the OLED to emit light according to the electrical signal. This compensation method can compensate for the uneven light emission brightness caused by aging of the light-emitting device.

FIG. 1 illustrates a schematic diagram of an OLED array substrate 100 according to an embodiment of the present disclosure. As shown in FIG. 1, the OLED array substrate 100 may include a substrate 110, an OLED 120 arranged on the substrate 110, and a photosensor PR positioned between the OLED 120 and the substrate 110. The photosensor PR may include a first electrode 131, a photosensitive layer 132, and a second electrode 133 sequentially arranged from bottom to top. The OLED 120 may include an anode 121, an organic light-emitting layer 122, and a cathode 123 sequentially arranged from bottom to top.

Figure 2:
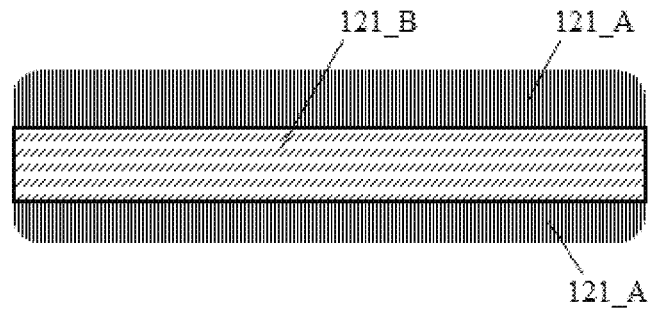
FIG. 2 illustrates a top view of a part of the OLED array substrate according to an embodiment of the present disclosure.

The anode 121 includes a first portion 121_A and a second portion 121_B. FIG. 2 illustrates a top view of a part of the OLED array substrate 100, which shows an example position relation of the first portion 121_A and the second portion 121_B of the anode 121.

Figure 3:
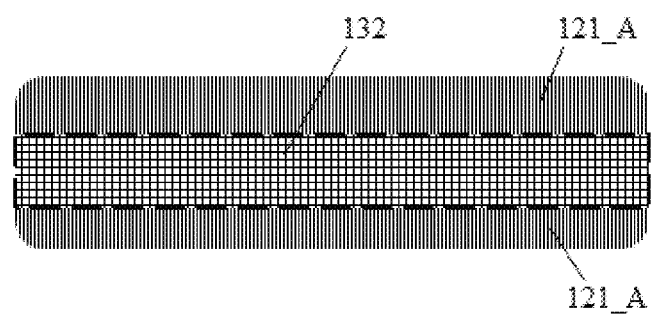
FIG. 3 illustrates a top view of a part of the OLED array substrate according to an embodiment of the present disclosure.

FIG. 3 illustrates a top view of a part of the OLED array substrate 100, which shows an example position relation of the first portion 121_A and the photosensitive layer 132. As shown in FIG. 3, an orthographic projection of the first portion 121_A on the substrate 110 does not overlap with an orthographic projection of the photosensitive layer 132 on the substrate 110.

An orthographic projection of the second portion 121_B on the substrate 110 overlaps with the orthographic projection of the photosensitive layer 132 on the substrate 110, and the second portion 121_B is transparent. The second electrode 133 includes the second portion 121_B of the anode 121.

In some embodiments of the present disclosure, the anode 121 includes a groove in the second portion 121_B of the anode 121. The second electrode 133 of the photosensor PR is arranged within the groove. In some embodiments of the present disclosure, a surface of the second electrode 133 away from the substrate 110 is flush with a surface of the anode 121 away from the substrate 110.

In some embodiments of the present disclosure, the OLED array substrate 100 may further include a pixel defining layer 124 positioned between the anode 121 and the organic light-emitting layer 122 and provided with an opening 125. A light emission region of the organic light-emitting layer 122 is positioned in the opening 125 of the pixel defining layer 124.

The present disclosure may adopt, for example, a top gate process, or may adopt a back channel etch (BCE) process and an etch stop layer (ESL) process, etc. The present disclosure may adopt a top emission structure. In this case, the first portion 121_A of the anode 121 is a light reflection layer and the cathode 123 is a light transmission layer. The present disclosure also may adopt a bottom emission structure. In this case, the anode 121 is the light transmission layer and the cathode 123 is the light reflection layer. Reference is made below taking the top emission structure as an example.

A transmissivity of the second portion 121_B of the anode 121 may be adjusted by setting a thickness of the anode 121. According to some embodiments of the present disclosure, the first portion 121_A of the anode 121 may be a reflective anode. In the process of light emission of the OLED, light is emitted upward in the first portion 121_A of the anode 121, but light is emitted downward in the second portion 121_B of the anode 121 so as to illuminate the photosensitive layer 132. In this way, the photosensitive layer 132 can sense a light emission intensity of the OLED, thereby enabling the photosensor PR to convert the sensed light emission intensity into an electrical signal. Next, other circuits (not shown) of the OLED array substrate 100 can adjust a drive current for driving the OLED to emit light according to the electrical signal, thereby compensating for uneven light emission brightness caused by aging of the light-emitting device.

It is to be noticed that a ratio of an area of the second portion 121_B of the anode 121 to an area of the light emission region of the organic light-emitting layer 122 should be appropriate, for example, less than or equal to 5%, so as to avoid negative effect on the overall display performance of the display device.

In some embodiments of the present disclosure, the OLED array substrate 100 may further include a first transistor T1 and a second transistor T2 positioned on the substrate 110 and on a side of the photosensor PR facing toward the substrate 110. As a drive transistor, the first transistor T1 provides a drive current to the OLED 120 to drive the OLED 120 to emit light. As a switch transistor, the second transistor T2 controls to provide the electrical signal converted by the photosensor PR to the aforementioned other circuits.

As shown in FIG. 1, a source/drain region 141 of the first transistor T1 may be correspondingly coupled to a source/drain electrode 142 of the first transistor T1. A source/drain region 151 of the second transistor T2 may be correspondingly coupled to a source/drain electrode 152 of the second transistor T2.

In some embodiments of the present disclosure, the OLED array substrate 100 may further include a first dielectric layer 170 and a second dielectric layer 160 sequentially arranged between the anode 121 and the substrate 110. The first dielectric layer 170 may be made out of the same type of dielectric material, and may include a first sublayer (for example, a passivation layer) 171 and a second sublayer (for example, a resin layer) 172 made out of different dielectric materials. The photosensitive layer 132 and the first electrode 131 of the photosensor PR may be positioned in the second sublayer 172. The source/drain electrode 142 of the first transistor T1 and the source/drain electrode 152 of the second transistor T2 are positioned in the first sublayer 171. An active layer and a gate stack of the first transistor T1 and an active layer and a gate stack of the second transistor T2 may be positioned in the second dielectric layer 160. The first electrode 131 of the photosensor PR may be electrically connected to the source/drain electrode 152 of the second transistor T2 through a first hole 181 in the first dielectric layer 170. The first portion 121_A of the anode 121 may be electrically connected to the source/drain electrode 142 of the first transistor T1 through a second hole 182 in the first dielectric layer 170.

In some embodiments of the present disclosure, the first electrode 131 of the photosensor PR may be formed by the same metal or metal alloy as the source/drain electrode 142 of the first transistor and the source/drain electrode 152 of the second transistor, or may formed by different metals or metal alloys with respect to the source/drain electrode 142 of the first transistor and the source/drain electrode 152 of the second transistor.

Those skilled in the art should appreciate that the photosensor PR may also be electrically connected to the second transistor T2 by other means. The OLED 120 may also be electrically connected to the first transistor T1 by other means. Embodiments of the present disclosure have no additional limitation thereto.

Figure 4:
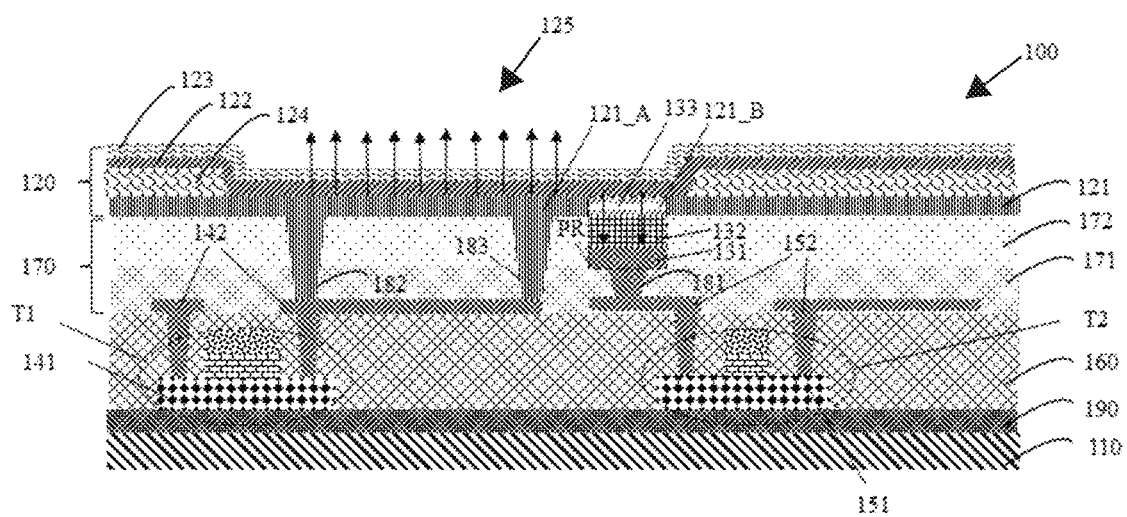
FIG. 4 illustrates a schematic diagram of an OLED array substrate according to another embodiment of the present disclosure.

FIG. 4 illustrates a schematic diagram of an OLED array substrate 100 according to another embodiment of the present disclosure. As shown in FIG. 4, the OLED array substrate 100 may further include a third hole 183 in the first dielectric layer 170 positioned between the first hole 181 and the second hole 182. The first portion 121_A of the anode 121 may be further electrically connected to the source/drain electrode 142 of the first transistor T1 through the third hole 183. The third hole 183 may allow the drive current from the first transistor T1 (i.e., the drive transistor) to be more evenly distributed on the anode 121, such that the display brightness of the OLED 120 is more even.

Figure 5:
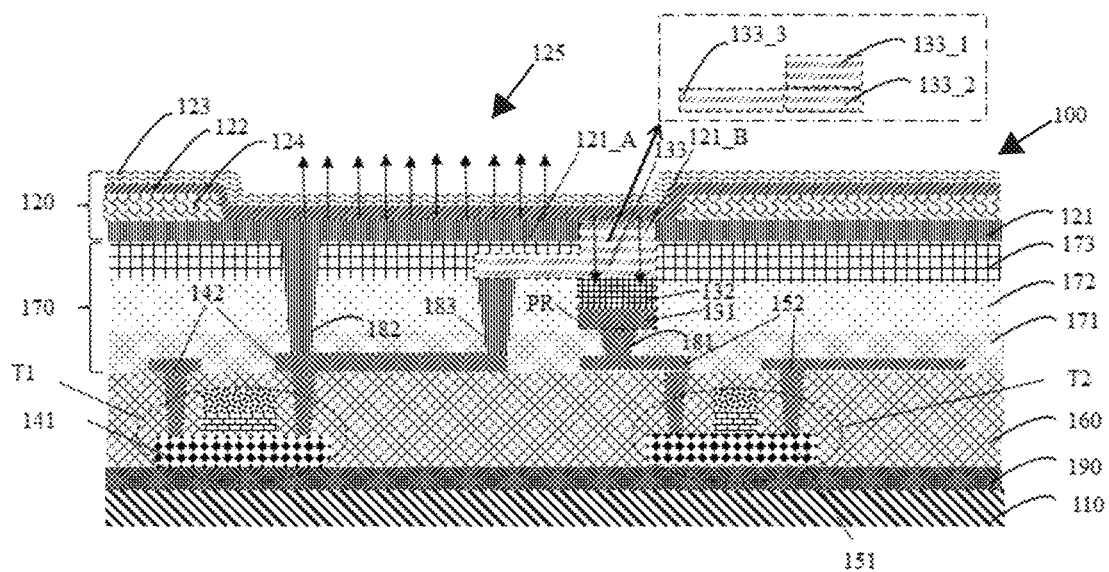
FIG. 5 illustrates a schematic diagram of an OLED array substrate according to still another embodiment of the present disclosure.

FIG. 5 illustrates a schematic diagram of an OLED array substrate 100 according to still another embodiment of the present disclosure. As shown in FIG. 5, the second portion 121_B of the anode 121 may serve as a first portion 133_1 of the second electrode 133. The second electrode 133 further includes a transparent second portion 133_2 and a third portion 133_3. The second portion 133_2 of the second electrode 133 is positioned between the first portion 133_1 of the second electrode 133 and the photosensitive layer 132. The third portion 133_3 of the second electrode 133 extends from the second portion 133_2 of the second electrode 133 to the second hole 182 and is spaced apart from the first portion 121_A of the anode 121. The OLED array substrate 100 may further include a third hole 183 in the first dielectric layer 170 positioned between the first hole 181 and the second hole 182. The third portion 133_3 of the second electrode 133 is electrically connected to the source/drain electrode 142 of the first transistor T1 through the third hole 183.

The first dielectric layer 170 may be made out of the same type of dielectric material, and may include a first sublayer (for example, a passivation layer) 171, a second sublayer (for example, a resin layer) 172, and a third sublayer (for example, a resin layer) 173 made out of different dielectric materials. The source/drain electrode 142 of the first transistor T1 and the source/drain electrode 152 of the second transistor T2 are positioned in the first sublayer 171. The photosensitive layer 132 and the first electrode 131 of the photosensor PR are positioned in the second sublayer 172. The second portion 133_2 and the third portion 133_3 of the second electrode 133 are positioned in the third sublayer 173. The third sublayer 173 may be made out of a material the same as the material of the second sublayer 172.

In this embodiment, the third hole 183 may allow the drive current from the first transistor T1 (i.e., the drive transistor) to be more evenly distributed on the anode 121, such that the display brightness of the OLED 120 is more even.

Figure 6:
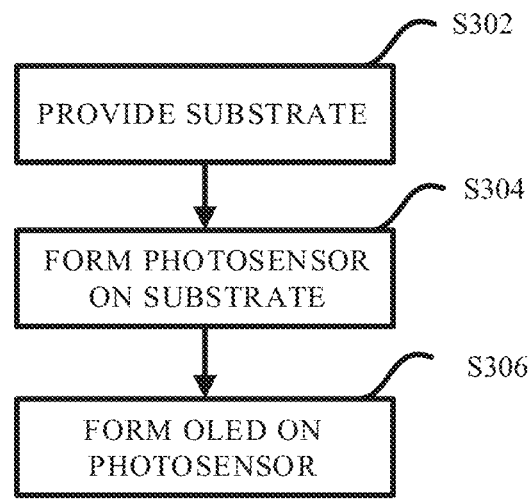
FIG. 6 illustrates a flowchart of a method for fabricating the OLED array substrate as shown in FIG. 1 according to an embodiment of the present disclosure.

FIG. 6 illustrates a flowchart of a method for fabricating the OLED array substrate 100 as shown in FIG. 1 according to an embodiment of the present disclosure. The method for fabricating the OLED array substrate 100 is described in detail below with reference to FIGS. 1 and 4-5.

As shown in FIG. 6, in this method, a substrate 110 may be provided in step S302. In some embodiments of the present disclosure, a buffer layer 190 may also be provided on the substrate 110.

Next, a photosensor PR may be formed on the substrate 110 in step S304. The photosensor PR may include a first electrode 131, a photosensitive layer 132, and a second electrode 133 sequentially arranged from bottom to top.

In some embodiments of the present disclosure, forming the photosensor PR may include forming a first dielectric layer 170 on the substrate 110, patterning the first dielectric layer 170 to form an opening 125, forming the first electrode 131 in the opening 125, forming the photosensitive layer 132 on the first electrode 131 in the opening 125, and forming the second electrode 133 on the photosensitive layer 132.

In some embodiments of the present disclosure, the first electrode 131, the photosensitive layer 132, and the second electrode 133 are formed using the same mask.

Next, an OLED 120 may be formed on the photosensor PR in step S306. The OLED 120 may include an anode 121, an organic light-emitting layer 122, and a cathode 123 sequentially arranged from bottom to top. The anode 121 includes a first portion 121_A and a second portion 121_B. An orthographic projection of the first portion 121_A on the substrate 110 does not overlap with an orthographic projection of the photosensitive layer 132 on the substrate 110. An orthographic projection of the second portion 121_B on the substrate 110 overlaps with the orthographic projection of the photosensitive layer 132 on the substrate 110, and the second portion 121_B is transparent. The second electrode 133 includes the second portion 121_B of the anode 121.

In some embodiments of the present disclosure, the forming the OLED 120 may include forming a conductive layer reflecting light on the first dielectric layer 170, patterning the conductive layer to remove a portion of the conductive layer whose orthographic projection on the substrate 110 overlaps with an orthographic projection of the photosensitive layer 132 on the substrate 110, wherein a remaining portion of the conductive layer forms the first portion 121_A of the anode 121, forming a pixel defining layer 124 having the opening on the anode 121, wherein an orthographic projection of the pixel defining layer 124 on the substrate 110 does not overlap with an orthographic projection of the photosensor PR on the substrate 110, forming the organic light-emitting layer 122 in the opening of the pixel defining layer 124 and on the pixel defining layer 124, and forming the cathode 123 on the organic light-emitting layer 122.

In some other embodiments of the present disclosure, the anode 121 may be a light transmission layer, and the anode 121 and the second electrode 133 are formed by the same film.

In some embodiments of the present disclosure, the method may further include prior to forming the first dielectric layer 170, forming a first transistor T1 and a second transistor T2 on the substrate 110, forming a second dielectric layer 160 on the substrate 110 to cover an active layer and a gate stack of the first transistor T1 and an active layer and a gate stack of the second transistor T2, and forming corresponding source/drain electrodes 142 and 152 respectively coupled to a source/drain region 141 of the first transistor T1 and a source/drain region 151 of the second transistor T2 through the second dielectric layer 160. The patterning the first dielectric layer 170 further includes forming a first hole 181 and a second hole 182. The first electrode 131 is coupled to the source/drain electrode 152 of the second transistor T2 through the first hole 181. The first portion 121_A of the anode 121 may be coupled to the source/drain electrode 142 of the first transistor T1 through the second hole 182.

In some embodiments of the present disclosure, the patterning the first dielectric layer 170 may further include forming a third hole 183 between the first hole 181 and the second hole 182. The first portion 121_A of the anode 121 may be further electrically connected to the source/drain electrode 142 of the first transistor T1 through the third hole 183. The third hole 183 may allow the drive current from the first transistor T1 (i.e., the drive transistor) to be more evenly distributed on the anode 121, such that the display brightness of the OLED 120 is more even.

In some other embodiments of the present disclosure, the patterning the first dielectric layer 170 further includes forming the third hole 183 between the first hole 181 and the second hole 182. The forming the second electrode 133 on the photosensitive layer 132 includes forming a transparent conductive material on the photosensitive layer 132, and patterning the transparent conductive material to form the second electrode 133. The second electrode 133 includes a first portion 133_1, a second portion 133_2, and a third portion 133_3. An orthographic projection of the first portion 133_1 and an orthographic projection of the second portion 133_2 on the substrate 110 are overlapped with an orthographic projection of the photosensitive layer 132 on the substrate 110. The second portion 133_2 is positioned between the first portion 133_1 and the photosensitive layer 132. The third portion 133_3 extends from the second portion 133_2 to the second hole 182 and is spaced apart from the first portion 121_A of the anode 121. The third portion 133_3 of the second electrode 133 is electrically connected to the source/drain electrode 142 of the first transistor T1 through the third hole 183. The third hole 183 may allow the drive current from the first transistor T1 (i.e., the drive transistor) to be more evenly distributed on the anode 121, such that the display brightness of the OLED 120 is more even.

Figure 7:
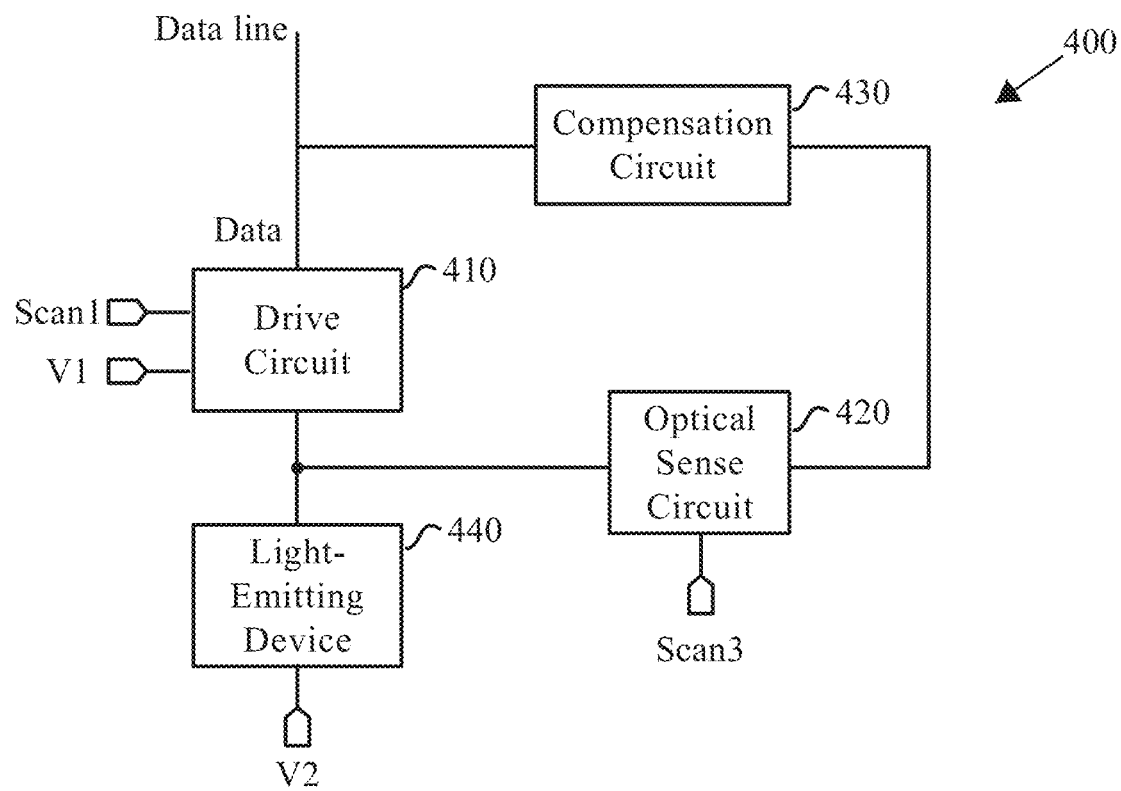
FIG. 7 illustrates a schematic block diagram of an OLED pixel circuit according to an embodiment of the present disclosure.

FIG. 7 illustrates a schematic block diagram of an OLED pixel circuit 400 according to an embodiment of the present disclosure. As shown in FIG. 7, the OLED pixel circuit includes a drive circuit 410, an optical sense circuit 420, a compensation circuit 430, and a light-emitting device 440. The drive circuit 410 is coupled to the compensation circuit 430, the optical sense circuit 420, the light-emitting device 440, a first scanning signal terminal, and a first voltage terminal. The drive circuit 410 is configured to drive the light-emitting device 440 to emit light. The optical sense circuit 420 is coupled to the drive circuit 410, the compensation circuit 430, the light-emitting device 440, and a third scanning signal terminal. The optical sense circuit 420 is configured to sense a light emission intensity of the light-emitting device 440 and convert the light emission intensity into an electrical signal. The compensation circuit 430 is coupled to the optical sense circuit 420 and the drive circuit 410. The compensation circuit 430 is configured to generate, based on the electrical signal from the optical sense circuit 420, a compensation voltage for compensating for the light emission intensity of the light-emitting device 440, and provide the compensation voltage to the drive circuit 410. The light-emitting device 440 is coupled to the drive circuit 410, the optical sense circuit 420, and a second voltage terminal. The light-emitting device 440 is configured to emit light under the drive of the drive current from the drive circuit.

The drive current for driving the OLED to emit light can be adjusted based on the compensation voltage provided by the drive circuit 410, thereby compensating for uneven light emission brightness caused by aging of the light-emitting device.

Figure 8:
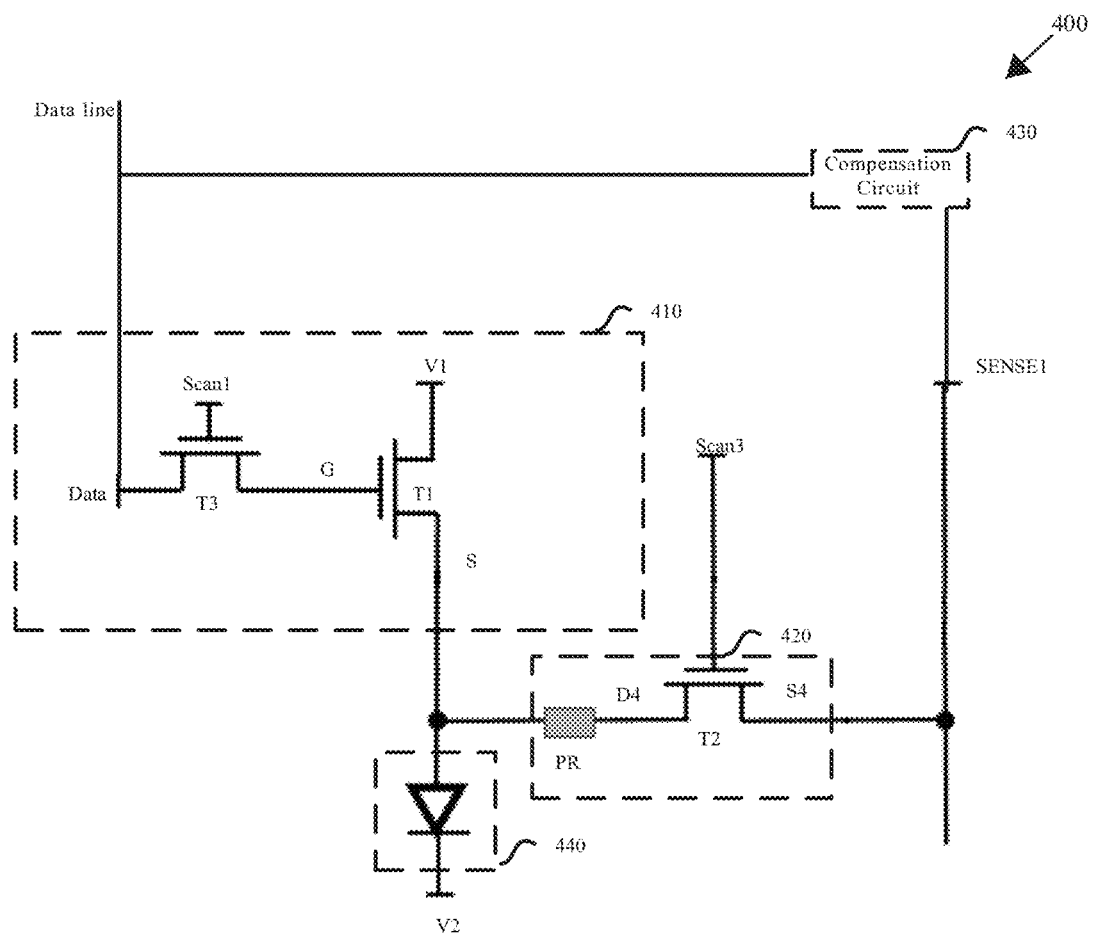
FIG. 8 illustrates an exemplary circuit diagram of an OLED pixel circuit according to an embodiment of the present disclosure.

FIG. 8 illustrates an exemplary circuit diagram of an OLED pixel circuit 400 according to an embodiment of the present disclosure. As shown in FIG. 8, the drive circuit 410 may include a first transistor T1 and a third transistor T3. A control electrode of the first transistor T1 is coupled to a second electrode of the third transistor T3. A first electrode of the first transistor T1 is coupled to a first voltage terminal V1, and a second electrode of the first transistor T1 is coupled to the optical sense circuit 420 and the light-emitting device 440. A control electrode of the third transistor T3 is coupled to a first scanning signal terminal Scan1. A first electrode of the third transistor T3 is coupled to a data signal terminal Data.

The optical sense circuit 420 may include a photosensor PR and a second transistor T2. A first electrode of the photosensor PR is coupled to a first electrode of the second transistor T2. A second electrode of the photosensor PR is coupled to a second electrode of the first transistor T1. A control electrode of the second transistor T2 is coupled to a third scanning signal terminal Scan3. A second electrode of the second transistor T2 is coupled to the compensation circuit 430. In the process of light emission of the OLED, a light emission intensity of the light-emitting device 440 is sensed via the photosensor PR, and the light emission intensity is converted into an electrical signal. At this moment, the second transistor T2 is enabled by controlling the voltage of the third scanning signal terminal. In this way, the converted electrical signal may be transmitted to a first sense terminal SENSE1 through the second transistor T2. According to an embodiment of the present disclosure, the photosensor PR may use the configuration described in accordance with FIG. 1.

The compensation circuit 430 is, for example, an integrated circuit IC. The IC is coupled to the first sense terminal SENSE1, such that the electrical signal converted by the photosensor may be obtained from the first sense terminal SENSE1. The IC can generate, based on the electrical signal, a compensation voltage for compensating for the light emission intensity of the light-emitting device 440. The IC is also coupled to the data signal terminal to provide the compensation voltage to the drive circuit 410.

The light-emitting device 440 may include an OLED. The anode of the OLED is coupled to the second electrode of the first transistor T1. The cathode of the OLED is coupled to the second voltage terminal V2.

Figure 9:
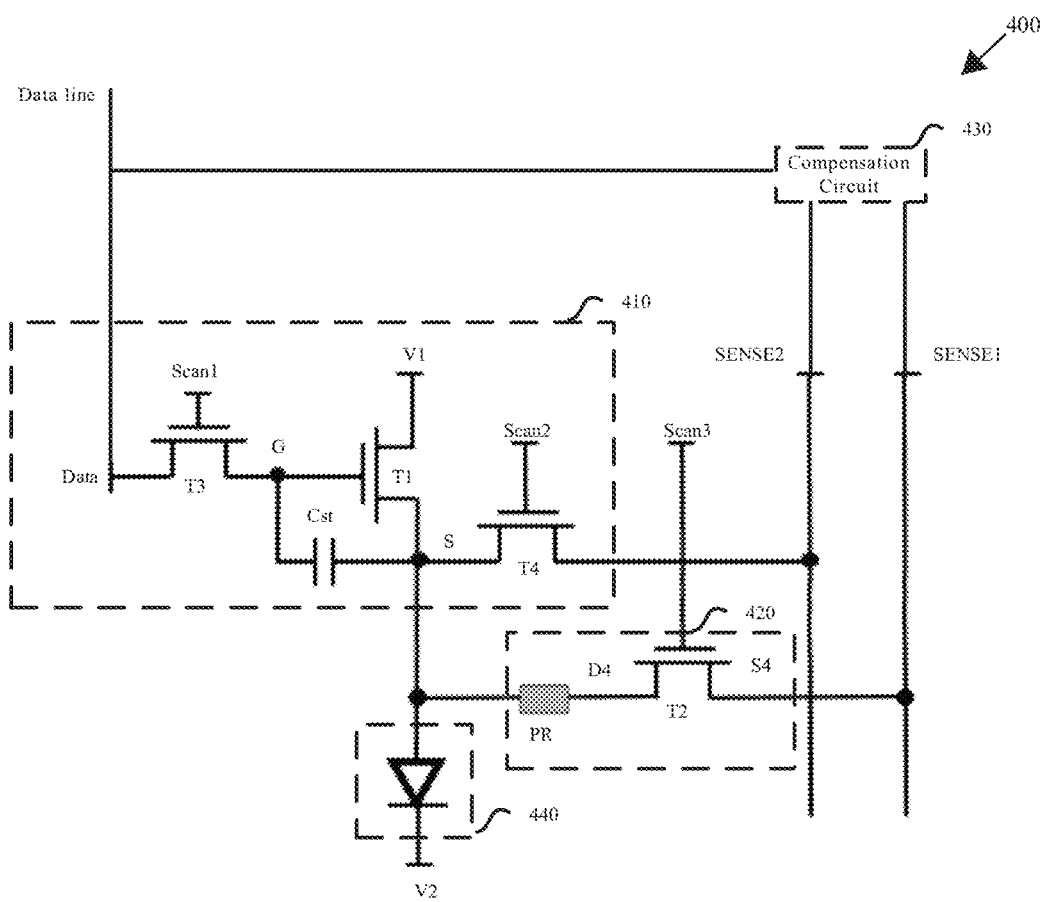
FIG. 9 illustrates another exemplary circuit diagram of an OLED pixel circuit according to an embodiment of the present disclosure.

FIG. 9 illustrates another exemplary circuit diagram of an OLED pixel circuit according to an embodiment of the present disclosure. As shown in FIG. 9, the drive circuit 410 may further include a fourth transistor T4 and a first capacitor Cst. A control electrode of the fourth transistor T4 is coupled to the second scanning signal terminal Scan2. A first electrode of the fourth transistor T4 is coupled to the second electrode of the first transistor T1. A second electrode of the fourth transistor T4 is coupled to the compensation circuit 430 via a second sense terminal. A first terminal of the first capacitor Cst is coupled to the control electrode of the first transistor T1. A second terminal of the first capacitor Cst is coupled to the second electrode of the first transistor T1. In this embodiment, a threshold voltage of the first transistor T1 (i.e., the drive transistor) is compensated in an external voltage compensation manner.

Figure 10:
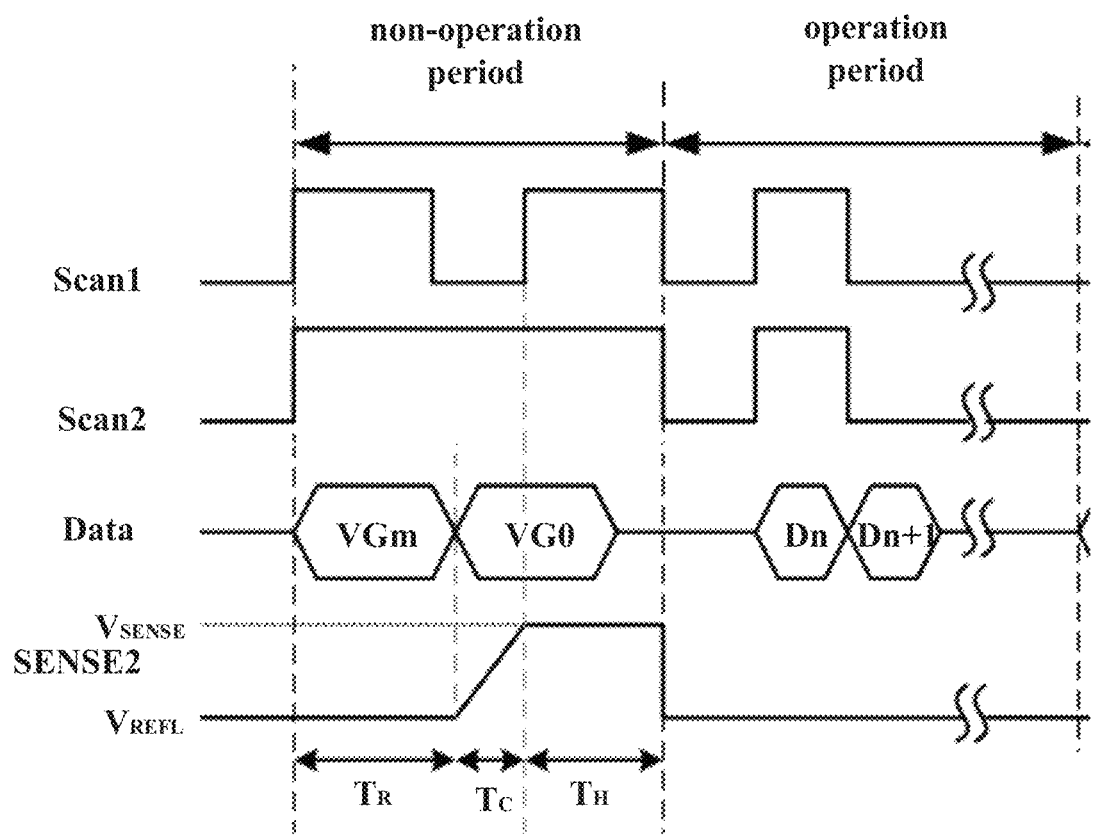
FIG. 10 illustrates a timing diagram of each signal of the OLED pixel circuit 400 as shown in FIG. 8 or 9 which is compensated in an external voltage compensation manner.

FIG. 10 illustrates a timing diagram of each signal of the OLED pixel circuit 400 as shown in FIG. 8 or 9 which is compensated in an external voltage compensation manner. During a non-operation period of the light-emitting device, firstly in a $T_R$ phase, the first transistor T1 is reset by enabling the third transistor T3 and the fourth transistor T4 such that the voltage at a point S is $V_{REFL}$ ($V_{REFL}$ is, for example, 0V). Next, in a $T_C$ phase, the third transistor T3 is disabled and the fourth transistor T4 continues being enabled, such that the current flowing through the first transistor T1 is outputted to the compensation circuit 430 through the second sense signal terminal SENSE2. As can be seen from FIG. 10, in the $T_C$ phase, the voltage of the second sense signal terminal SENSE2 gradually rises. Finally, in the $T_H$ phase, the sensing charge is completed. The third transistor T3 and the fourth transistor T4 are enabled, and the voltage of the second sense signal terminal SENSE2 is maintained at $V_{SENSE}$. The compensation circuit 430 calculates the voltage need to be compensated for adding the compensated voltage to the voltage of the data signal later on. In FIG. 10, as to the data signal terminal Data, the maximum value of the voltage of the data signal terminal Data is schematically represented by VGm, and the minimum value of the voltage of the data signal terminal Data is schematically represented by VG0. During an operation period of the light-emitting device, the data signals (Dn, Dn+1, . . . ) after compensation are used to drive the light emitting device OLED 120 to emit light normally, which will not be described in detail herein.

The OLED pixel circuit 400 according to this embodiment not only can adopt conventional electrical compensation methods, but also can adopt the optical compensation method according to embodiments of the present disclosure.

By using a photosensitive feedback structure in combination with the electrical compensation method, the evenness of the display brightness can be better improved.

Figure 11:
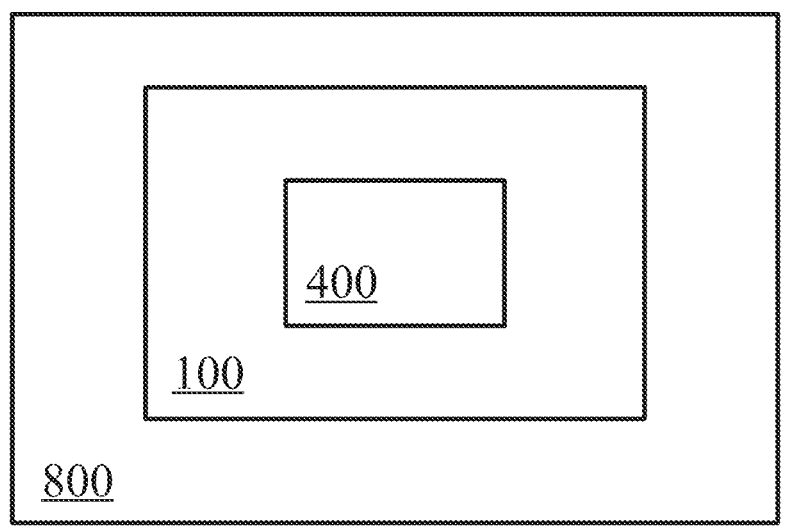
FIG. 11 illustrates a schematic structural diagram of a display device according to an embodiment of the present disclosure.

FIG. 11 illustrates a schematic structural diagram of a display device 800 according to an embodiment of the present disclosure. The display device 800 may include the aforementioned OLED array substrate 100 or the OLED array substrate 100 of the aforementioned OLED pixel circuit 400. The display apparatus provided by the embodiments of the present disclosure may be used in any product having a display function, such as an electronic paper display, a mobile phone, a tablet computer, a TV set, a notebook computer, a digital photo frame, a wearable device or a navigation device, and so on.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protection of the present disclosure is limited by the appended claims.

What is claimed is:

1. A method for fabricating an OLED array substrate, the method comprising:
    providing a substrate;
    forming a photosensor on the substrate; and
    forming an OLED on the photosensor;
    wherein the photosensor comprises a first electrode, a photosensitive layer, and a second electrode sequentially arranged from bottom to top;
    wherein the OLED comprises an anode, an organic light-emitting layer, and a cathode sequentially arranged from bottom to top; and
    wherein the anode comprises a first portion and a second portion, wherein an orthographic projection of the first portion on the substrate does not overlap with an orthographic projection of the photosensitive layer on the substrate, wherein an orthographic projection of the second portion on the substrate overlaps with the orthographic projection of the photosensitive layer on the substrate and the second portion is transparent, and wherein the second electrode comprises the second portion of the anode.

2. The method according to claim 1, wherein forming the photosensor comprises:
    forming a first dielectric layer on the substrate;
    patterning the first dielectric layer to form an opening;
    forming the first electrode in the opening;
    forming the photosensitive layer on the first electrode in the opening; and
    forming the second electrode on the photosensitive layer.

3. The method according to claim 2, wherein forming the OLED comprises:
    forming a conductive layer reflecting light on the first dielectric layer;
    patterning the conductive layer to remove a portion of the conductive layer whose orthographic projection on the substrate overlaps with an orthographic projection of the photosensitive layer on the substrate, wherein a remaining portion of the conductive layer forms the first portion of the anode;
    forming a pixel defining layer having the opening on the anode, wherein an orthographic projection of the pixel defining layer on the substrate does not overlap with an orthographic projection of the photosensor on the substrate;
    forming the organic light-emitting layer in the opening of the pixel defining layer and on the pixel defining layer; and
    forming the cathode on the organic light-emitting layer.

4. An organic light-emitting diode (OLED) array substrate comprising:
    a substrate;
    an OLED arranged on the substrate; and
    a photosensor positioned between the OLED and the substrate;
    wherein the photosensor comprises a first electrode, a photosensitive layer, and a second electrode sequentially arranged from bottom to top;
    wherein the OLED comprises an anode, an organic light-emitting layer, and a cathode sequentially arranged from bottom to top; and
    wherein the anode comprises a first portion and a second portion, wherein an orthographic projection of the first portion on the substrate does not overlap with an orthographic projection of the photosensitive layer on the substrate, wherein an orthographic projection of the second portion on the substrate overlaps with the orthographic projection of the photosensitive layer on the substrate and the second portion is transparent, and wherein the second electrode comprises the second portion of the anode.

5. The OLED array substrate according to claim 4, wherein i) the first portion of the anode is a light reflection layer and the cathode is a light transmission layer, or ii) the anode is the light transmission layer and the cathode is the light reflection layer.

6. The OLED array substrate according to claim 4, wherein a ratio of an area of the second portion of the anode to an area of the light emission region of the organic light-emitting layer is less than or equal to 5%.

7. The OLED array substrate according to claim 4, wherein the anode comprises a groove in the second portion of the anode, and wherein the second electrode is arranged within the groove.

8. The OLED array substrate according to claim 4, wherein a surface of the second electrode away from the substrate is flush with a surface of the anode away from the substrate.

9. A display device comprising the OLED array substrate according to claim 4.

10. The OLED array substrate according to claim 4 further comprising a first transistor and a second transistor positioned on the substrate and on a side of the photosensor facing toward the substrate, and a first dielectric layer and a second dielectric layer sequentially arranged between the anode and the substrate;

wherein an active layer and a gate stack of the first transistor and an active layer and a gate stack of the second transistor are positioned in the second dielectric layer, and wherein the photosensitive layer and the first electrode of the photosensor are positioned in the first dielectric layer;

wherein the first electrode of the photosensor is electrically connected to a source/drain electrode of the second transistor through a first hole in the first dielectric layer; and wherein the first portion of the anode is electrically connected to a source/drain electrode of the first transistor through a second hole in the first dielectric layer.

11. The OLED array substrate according to claim 10, wherein the second portion of the anode serves as a first portion of the second electrode, wherein the second electrode further comprises a transparent second portion and a third portion, wherein the second portion of the second electrode is positioned between the first portion of the second electrode and the photosensitive layer, and wherein the third portion of the second electrode extends from the second portion of the second electrode to the second hole and is spaced apart from the first portion of the anode;

wherein the OLED array substrate further comprises a third hole in the first dielectric layer positioned between the first hole and the second hole; and wherein the third portion of the second electrode is electrically connected to the source/drain electrode of the first transistor through the third hole.

12. The OLED array substrate according to claim 11, wherein the first dielectric layer comprises a first sublayer, a second sublayer, and a third sublayer sequentially arranged between the substrate and the anode;

wherein the source/drain electrode of the first transistor and the source/drain electrode of the second transistor are positioned in the first sublayer;

wherein the photosensitive layer and the first electrode of the photosensor are positioned in the second sublayer; and wherein the second portion and the third portion of the second electrode are positioned in the third sublayer.

13. The OLED array substrate according to claim 10 further comprising a third hole in the first dielectric layer and positioned between the first hole and the second hole; and wherein the first portion of the anode is further electrically connected to the source/drain electrode of the first transistor through the third hole.

14. The OLED array substrate according to claim 13, wherein the first dielectric layer comprises a first sublayer and a second sublayer sequentially arranged between the substrate and the anode;

wherein the source/drain electrode of the first transistor and the source/drain electrode of the second transistor are positioned in the first sublayer; and wherein the photosensitive layer and the first electrode of the photosensor are positioned in the second sublayer.

15. An OLED pixel circuit in the OLED array substrate according to claim 4, the OLED pixel circuit comprising a drive circuit, an optical sense circuit, a compensation circuit, and a light-emitting device;

wherein the drive circuit is coupled to the compensation circuit, the optical sense circuit, and the light-emitting device, and is configured to drive the light-emitting device to emit light;

wherein the optical sense circuit is coupled to the drive circuit, the compensation circuit, and the light-emitting device, and is configured to sense a light emission intensity of the light-emitting device and convert the light emission intensity into an electrical signal; and wherein the compensation circuit is coupled to the optical sense circuit and the drive circuit, and is configured to generate, based on the electrical signal, a compensation voltage for compensating for the light emission intensity of the light-emitting device, and provide the compensation voltage to the drive circuit.

16. The OLED pixel circuit according to claim 15, wherein the optical sense circuit further comprises a photosensor and a second transistor;

wherein a first electrode of the photosensor is coupled to a first electrode of the second transistor, and wherein a second electrode of the photosensor is coupled to the drive circuit and the light-emitting device; and wherein a control electrode of the second transistor is coupled to a third scanning signal terminal, and wherein a second electrode of the second transistor is coupled to the compensation circuit.

17. The OLED pixel circuit according to claim 15, wherein the light-emitting device comprises an OLED.

18. An OLED array substrate comprising the OLED pixel circuit according to claim 15.

19. The OLED pixel circuit according to claim 15, wherein the drive circuit comprises a first transistor and a third transistor;

wherein a control electrode of the first transistor is coupled to a second electrode of the third transistor, wherein a first electrode of the first transistor is coupled to a first voltage terminal, and wherein a second electrode of the first transistor is coupled to the optical sense circuit and the light-emitting device; and wherein a control electrode of the third transistor is coupled to a first scanning signal terminal, and wherein a first electrode of the third transistor is coupled to a data signal terminal.

20. The OLED pixel circuit according to claim 19, wherein the drive circuit further comprises a fourth transistor and a first capacitor;

wherein a control electrode of the fourth transistor is coupled to a second scanning signal terminal, wherein a first electrode of the fourth transistor is coupled to the second electrode of the first transistor, and wherein a second electrode of the fourth transistor is coupled to the compensation circuit; and wherein a first terminal of the first capacitor is coupled to the control electrode of the first transistor, and wherein a second terminal of the first capacitor is coupled to the second electrode of the first transistor.

\* \* \* \* \*